INVENTOR.
ALBERT H. MEDWIN
BY
Eugene M. Whitacre
Attorney

SEMICONDUCTOR TRANSLATING CIRCUIT

Filed Oct. 30, 1964

INVENTOR.
ALBERT H. MEDWIN
BY Eugene M. Whitacre
Attorney 3,390,314

SEMICONDUCTOR TRANSLATING CIRCUIT

Albert H. Medwin, Whippany, N.J., assignor to Radio Corporation of America, a corporation of Delaware Filed Oct. 30, 1964, Ser. No. 407,636
8 Claims. (Cl. 317—235)

ABSTRACT OF THE DISCLOSURE

A notch filter is provided by an insulated-gate field-effect transistor connected between an input circuit and an output circuit. Biasing voltages are applied to the gate electrode and to the substrate to vary the resistances and capacitances of the device to tune the frequency of the notch.

This invention relates to monolithic semiconductor networks and more particularly to semiconductor networks which utilize active elements as voltage variable resistors and capacitors.

Presently, entire electronic networks and circuits are being fabricated entirely within a single tiny wafer of semiconductor material. Various portions of the material act as discrete circuit elements, and other portions of the material or fabricated metal coatings serve to make the required internal connections. In the practice of making the miniature electronic networks a variety of resistors and capacitors can be formed within a single tiny wafer of semiconductor material. On the other hand, the fabrication of inductive type components or the designs of tuned circuits is not readily adaptable to presently known status of the semiconductor art. This presents a problem in the design of networks for monolithic frequency selective amplifiers or oscillator circuits.

It is therefore an object of this invention to provide an improved semiconductor network.

It is a further object of this invention to provide an improved semiconductor network which functions as a voltage variable tuned circuit.

It is still a further object of this invention to provide an improved electrically variable semiconductor network that can be embodied in monolithic circuits to provide an electrically variable frequency selective circuit.

A signal translating circuit embodying the invention comprises a field effect semiconductor device having first and second electrodes on a substrate of semiconductor material defining a current path between the first and second electrodes, and an insulated control or gate electrode for controlling current between the first and second electrodes. Both the first and second electrodes form rectifying junctions with the substrate. The current path between the first and second electrodes of the semiconductor device is connected between input and output circuits for bidirectional current conduction, while the gate and substrate are connected in common with the input and output circuits. The frequency response of the above described translating circuit resembles that of a notch filter.

In accordance with a feature of the invention a variable bias voltage may be applied to the gate electrode, the polarity and magnitude of which, controls the frequency response of the translating circuit.

In accordance with another feature of the invention a variable bias voltage may be applied to the substrate electrode, the magnitude and polarity of which also controls the frequency response of the translating circuit.

The novel features which are considered characteristic of the invention are set forth with particularity in the appended claims. The invention itself, however, both as to its organization and method of operation as well as additional objects and advantages thereof will best be understood from the accompanying drawings in which:

Figure 1:
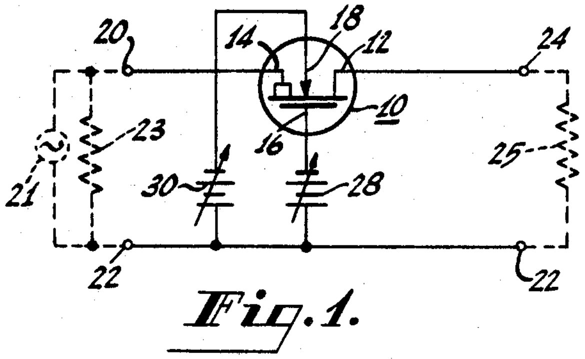
FIGURE 1 is a circuit diagram of a semiconductor network embodying the invention.

In referring to the drawings, like elements and parts are designated by like reference characters throughout the figures. FIGURE 1 is a schematic circuit diagram illustrating the connection of a metal-oxide-semiconductor (MOS) transistor 10 (shown by the symbolic configuration) as an electrically variable filter. The transistor 10 is a known type of MOS unit having two regions of similar conductivity (representing the source and drain regions) diffused in a substrate of semiconductor material of opposite conductivity, and having an insulated gate electrode overlying and controlling the resistivity of the portion of the substrate between the two regions. The boundaries or interface separating the diffused regions and the substrate form rectifying junctions. In the case where the substrate is of a P type material relative to the diffused regions, the anode of each rectifying junction is formed in the substrate while the cathode is formed by the diffused source and drain regions so that a positive bias voltage applied to the substrate, with respect to the voltages on the regions render, the junctions conductive. The transistor can also be fabricated with an N-type substrate relative to the source and drain regions wherein the rectifying junctions would be poled such that the anodes appear at the regions and the cathodes at the substrate. For the sake of consistency, the MOS units described throughout the figures will be one in which the substrate is of a P material relative to the diffused regions.

It should be noted that the diffused regions normally operate as drain and source regions as a function of the polarity of the potential applied therebetween; i.e., the electrode to which a positive potential is applied (relative to the potential applied to the other region) operates as a drain region, and the other region operates as a source region. If connected to an alternating current source, the designated regions will act as both source and drain regions depending upon the instantaneous polarity of the input signal. This is possible because fundamentally the MOS transistor acts as a variable resistor which is controlled by means of a capacity related gate electrode.

The circuit of FIGURE 1 is symmetrical wherein the terminals 20 and 24 can act either as input or output terminals. The terminals 22 are common terminals to both the input and output circuits. In the present case, input signals are applied across the terminals 20 and 22 by a signal source 21 having an internal impedance 23 (shown as dashed components) and the output signals are developed across a load or utilization circuit 25 (also shown dashed) connected across the terminals 24 and 22. The terminal 20 is connected to a source electrode 14 of transistor 10, while the terminal 24 is connected to a drain electrode 12. The signal connections to the terminals, or the interconnection of the terminals to the drain and source electrodes can be reversed and the operation of the circuit will remain substantially the same. An electrode 16 is the insulated gate electrode while an electrode 18 is connected to the substrate. Variable direct current bias sources 28 and 30 are connected between the gate electrode 16 and the common terminal 22 and between the substrate electrode 18 and the common terminal 22 respectively.

Figure 2:
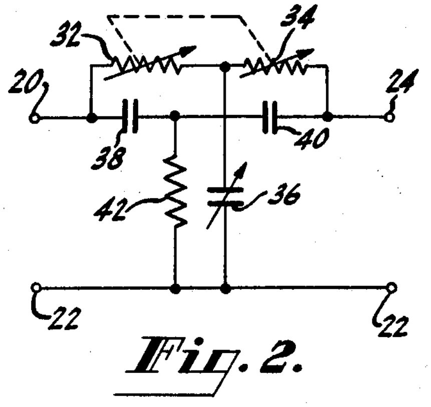
FIGURE 2 is an equivalent circuit of the semiconductor network of FIGURE 1.

FIGURE 2 is the effective alternating current (A-C) equivalent circuit of the circuit shown in FIGURE 1. The terminals in FIGURE 2 are designated by the same reference numerals as in FIGURE 1. The channel resistance between the transistor 10 drain and source electrodes 12 and 14 is represented by the series variable resistors 32 and 34 while the total effective diode capacitance between both the source region and the substrate, and the drain region and the substrate is represented by a variable capacitor 36. The series capacitors 38 and 40 effectively represent the capacitance between the gate electrode and both the source and drain regions respectively. The resistor 42 shown center tapped between the capacitors 38 and 40 effectively represents the input impedance of the gate electrode 16.

The magnitude of the equivalent capacitor 36 is changed by varying the value and polarity of bias source 30. By reverse biasing the substrate with respect to the drain and source electrodes, as shown in FIGURE 1, the rectifying junctions formed at the source-substrate interface and at the drain-substrate interface exhibit voltage controlled capacitance characteristics.

The magnitude of the equivalent variable resistors 32 and 34 (FIGURE 2) is changed by varying the value of the biasing source 28 applied to the gate electrode 16. The gate electrode 16 controls the resistivity of the corresponding channel between the drain and source region. The effect of a gate voltage upon the conductivity of an MOS transistor unit is known and does not need any further explanation.

Figure 3:
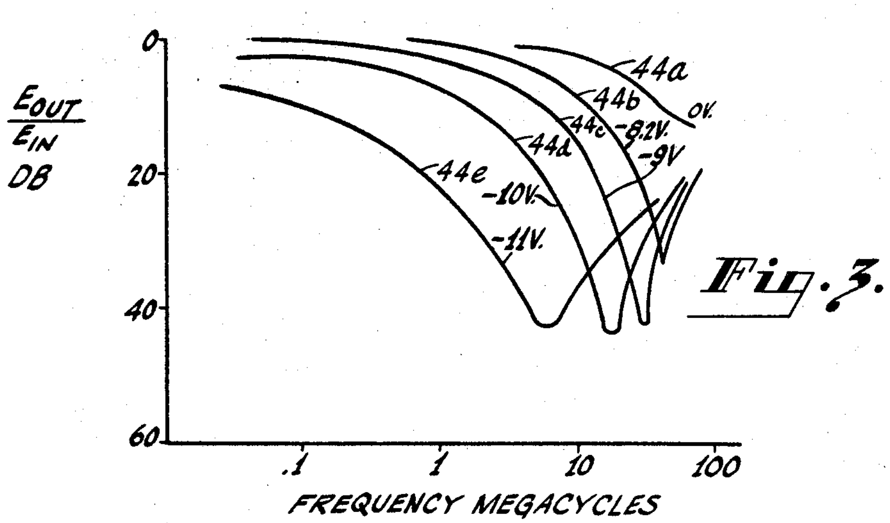
FIGURE 3 is a graph of a family of frequency response curves of the circuit of FIGURE 1 as a function of gate voltage.

FIGURE 3 represents a family of frequency response curves for the circuit of FIGURE 1 using a Radio Corporation of America TA–2330 MOS transistor, with input signals applied across terminals 20 and 22 and output signals taken across terminals 24 and 22, plotted as a function of the magnitude of the gate electrode biasing voltage source 28 with the substrate electrode 18 connected to the common terminal 22. By varying the gate biasing voltage, the magnitude of the equivalent resistors 32 and 34 are effectively changed and the notch frequency of the filter is correspondingly shifted. By making the gate voltage less negative with respect to the common terminal 22, the notch frequency is increased as shown by the curves 44*a*–44*e* of FIGURE 3. After the gate voltage reaches a negative 8.2 volts relative to the common terminal 22 with this particular transistor, further decreases in gate voltage reduce the depth of the notch as shown by the curves 44*a* and 44*b*. The depth of the notch is reduced because the channel resistance is reduced (resistors 32 and 34) thereby swamping out the frequency response effects of the network.

If the biasing voltage source 30 (substrate bias) is varied, the magnitude of the equivalent capacitor 36 is effectively changed and a similar shift in the frequency response will be observed (not shown) but of lesser magnitude or range than that observed in varying the gate electrode biasing source 28. In effect, voltage variations at gate electrode 16 can be considered rough tuning, while variations in the bias on the substrate electrode 18 can be considered fine tuning.

It should be noted, that an important advantage of insulated-gate field-effect transistors is the ability to alter the zero bias drain current characteristic during the device manufacturing process. Thus by designing the area of the source and drain rectifying junctions to be relatively large (capacitor 36) and controlling the processing to establish a low zero bias drain current characteristic (high valued resistors 32 and 34) a response curve similar to that shown by curve 44*e* can be achieved without applying any biasing voltage to the gate electrode 16 or the substrate electrode 18.

The depth of the notch of the curves of FIGURE 3 can be decreased by inserting a series resistor between the biasing source 28 and the gate electrode 16. The depth of the notch will be decreased as the size of the resistor is increased.

Figures 4, 5:
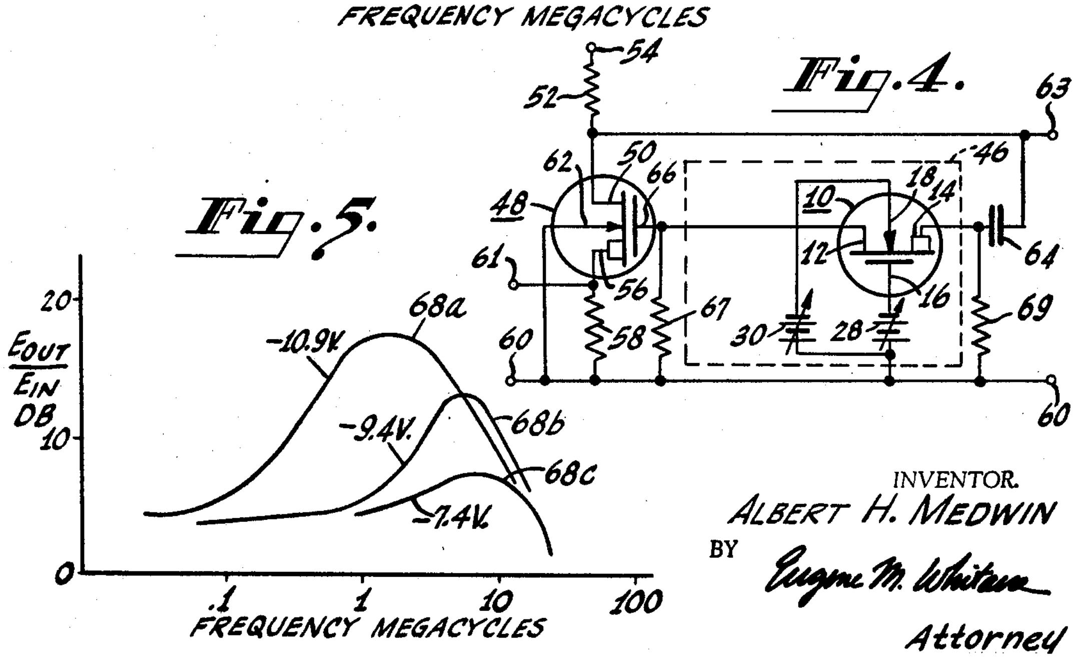
FIGURE 4 is a circuit representation of a monolithic frequency selective amplifier including the semiconductor network of FIGURE 1.
FIGURE 5 is a graph of a family of frequency response curves of a frequency selective amplifier of FIGURE 4 as a function of gate voltage.

Reference is now made to FIGURE 4 of the drawings, which is a schematic circuit diagram of a frequency selective amplifier employing the insulated-gate field-effect filter circuit of FIGURE 1 (shown enclosed in the dashed block 46) and a field-effect transistor 48 connected in an amplifier configuration. A drain electrode 50 of the transistor 48 is connected to a source of energizing potential applied to a terminal 54, through a resistor 52. A source electrode 56 of the transistor 48 is connected through a resistor 58 to a common reference terminal 60 while a substrate electrode 62 is directly connected to terminal 60. Input signals to be amplified are applied across the resistor 58 through input terminals 61 and 60 and the amplified signals are derived across output terminals 63 and 60. The output signal is fed back through a capacitor 64 and the source-to-drain current path of transistor 10 to the gate electrode 66 of the transistor 48. The common connection between the biasing voltage sources 28 and 30 is connected to the common terminal 60. Resistors 69 and 67 connected between the source electrode 14 and the drain electrode 12 via the common terminal 60, respectively, provide a return current path for the substrate biasing voltage source 30.

In operation, the signal developed across load resistor 52 is fed back to the gate electrode 66 of transistor 48 as modified by the filter circuit (within dashed block 46). Since there is 180° of phase shift between the gate electrode 66 and the drain electrode 50 of the transistor 48, the feedback is negative. At the notch frequencies, the signal feedback to the gate electrode 66 is highly attenuated resulting in a minimum amount of negative feedback thereby allowing maximum amplifier gain.

FIGURE 5 is a graphic representation of the frequency response of the frequency selective amplifier of FIGURE 4, plotted as a function of the magnitude of the gate biasing voltage source 28 with the substrate electrode 18 of transistor 10 connected directly to the common terminal 60. In this circuit, resistor 58 is set at 50 ohms, resistor 52 at 5,000 ohms, resistor 67 at 10 kilohm, resistor 69 at 5 kilohm and capacitor 64 at 150 picofarads. Curve 68*a* is the frequency response of the frequency selective circuit with a gate electrode 16 voltage of negative 10.9 volts while curves 68*b* and 68*c* show the frequency response by decreasing (less negative with respect to terminal 60) gate electrode voltages. As noted, the peak frequency and the peak height of the frequency response curves both vary with the amplitude of the gate bias voltage. Variations in the substrate biasing voltage source 30 produce similar results but with a smaller range than that due to variations in the gate biasing voltage source 28.

Figure 6:
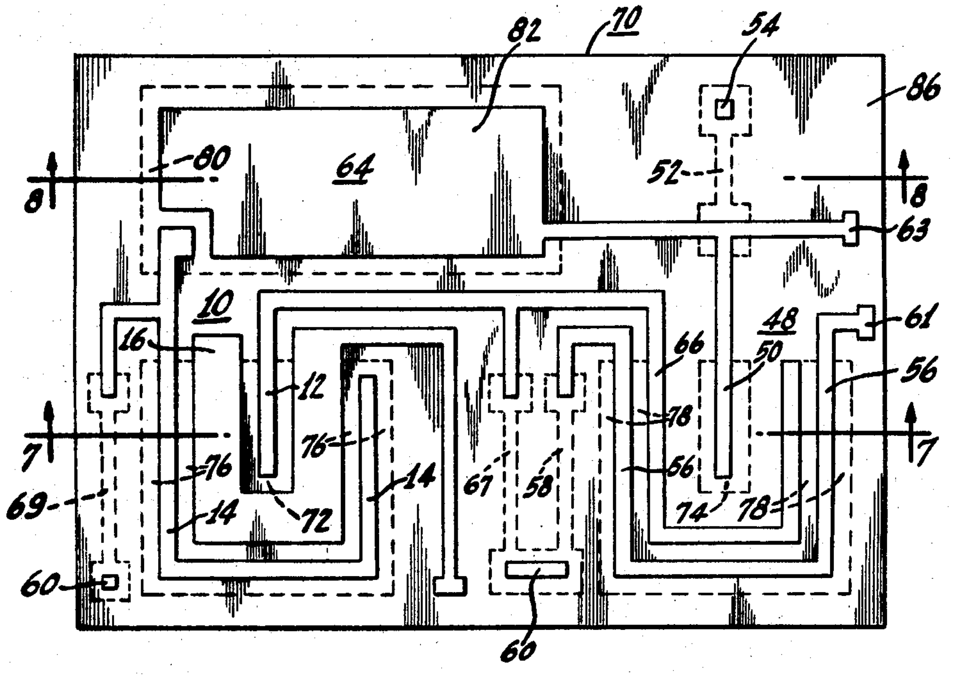
FIGURE 6 is a diagrammatic plan view of the monolithic frequency selective amplifier of FIGURE 4.
Figure 7:
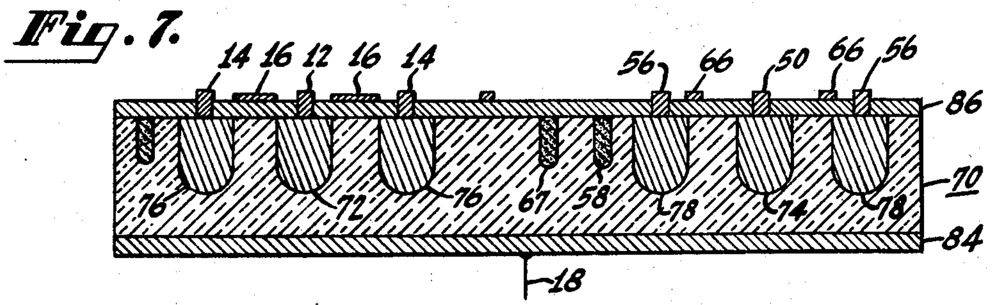
FIGURE 7 is a cross-sectional view of a portion of FIGURE 6 taken along section lines 7—7.
Figure 8:
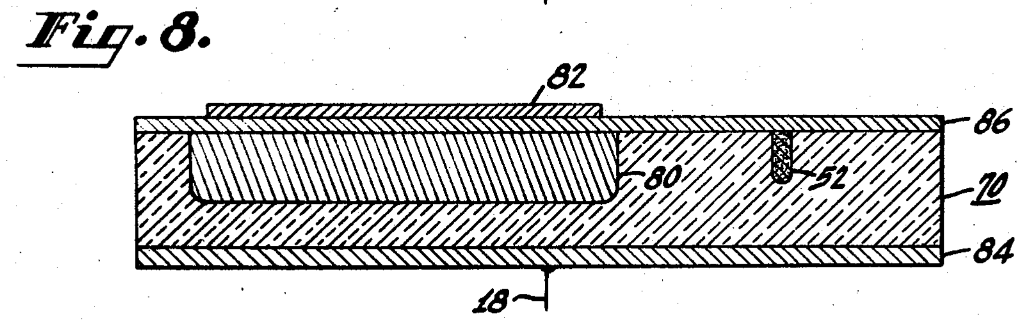
FIGURE 8 is a cross-sectional view of a portion of FIGURE 6 taken along section lines 8—8.

FIGURE 6 is a diagrammatic view of the field-effect transistor frequency selective amplifier of FIGURE 4 fabricated on a single semiconductor wafer 70. FIGURES 7 and 8 are cross-sectional views of the monolithic frequency selective amplifier to FIGURE 6 taken along lines 7—7 and 8—8 respectively, illustrating the diffusion of the various regions of the transistors 10 and 48, the resistors 52, 58, 67 and 69 and the diffused region 80 of capacitor 64, and the interrelation of the insulated gate electrodes to the diffused regions of the respective transistors. The silicon wafer is shown mounted on a conductive base or header 84 to which the substrate electrode 18 is connected. The reference numerals used to designate the various components of the amplifier circuit of FIGURE 4, designate similar components in FIGURES 6, 7 and 8 wherever practical.

The method of manufacturing the device shown in FIGURES 6, 7 and 8 is quite similar to that used in the manufacture of single MOS devices. The semiconductor wafer 70 is first heated at high temperatures in a dry atmosphere to create a silicon dioxide layer over the entire wafer. By photoresist and etching means the drain regions 72 and 74, source regions 76 and 78 of transistors 10 and 48 respectively, and the diffused capacitor region 80 are exposed. The wafer 70 is then heated in an atmosphere of phosphorous or any other suitable N-type gas to diffuse N type impurities into the wafer. The entire wafer 70 is then stripped of the remainder of the silicon dioxide layer leaving the diffused drain, source and capacitor regions intact.

The resistors 52, 58, 67 and 69 are now formed by repeating the series of similar steps. Here the wafer 70 is again oxidized in the furnace containing a dry atmosphere to create a silicon dioxide layer over the entire wafer. By photoresist and etching means, the regions for resistors 52, 58, 67 and 69 are exposed. The wafer 70 is then heated in an atmosphere of a phosphor type gas or any other type N-type diffusion gas to diffuse into the wafer 70 the resistors 52, 58, 67 and 69 (shown stippled).

The remainder of the silicon dioxide coating on wafer 70 is now stripped and a thin silicon dioxide insulating layer 86 (FIGURES 7 and 8) is grown over the entire wafer by heating the wafer in a furnace with dry atmosphere. By photoresist and etching means, the diffused drain, source, resistor and capacitor regions are partially exposed for a contact pattern for the drain electrodes 12 and 50, the source electrodes 14 and 56, and connection to the various diffused resistor and capacitor regions. The entire wafer is then metallized by evaporation of a conductive material such as chromium or gold or any other suitable material. By photoresist and etching means, the excess material is removed leaving the metallized insulated gate electrodes 16 and 66, the drain electrode 12 and 50, source electrodes 14 and 56, the capacitor plate 82, and the interconnecting contact areas (FIGURES 6, 7 and 8).

It should be noted that the gate electrode 16 of transistor 10 covers the entire channel region between the diffused drain and source regions 72 and 76 while the gate electrode 66 of transistor 48 only overlies a part of the channel region and is located adjacent the diffused source region 78 (FIGURES 6 and 7). In the present example, the gate electrode 66 of transistor 48 is displaced nearer to the source region 78 to increase the high frequency performance of transistor 48 by minimizing interelectrode capacitances (Miller effect) between the gate electrode 66 and the drain electrode 50.

By changing the physical location of the gate electrode 16 of transistor 10, the frequency response characteristics of the transistor 10 can be changed. The magnitude of the inter-electrode capacitance between the gate electrode and the drain and source region (and hence the magnitude of capacitance of the effective capacitors 38 and 40 of FIGURE 2) is a direct function of the physical layout of the field-effect transistor depending primarily upon the physical area of the drain and source diffused regions 72 and 76 and the area of the gate electrode 16, and the physical relation between the units. As previously mentioned, the gate electrode 16 completely overlies the channel between the drain and source regions 72 and 76 respectively (FIGURES 6 and 7). The value of gate-to-source and gate-to-drain capacitance (capacitors 38 and 40) can be further increased by overlapping the gate electrode 16 over the diffused drain and source regions or by increasing the adjacent areas between the source and drain region and gate electrode (increasing the size of the gate electrode and drain and source regions) or both. The gate to source or drain capacitance of transistor 10 can be decreased from that of FIGURES 6 and 7 by decreasing the width of the gate electrode 16 (as viewed in FIGURE 7) to less than that shown. In such case the value of the equivalent capacitors 38 and 40 of the notch filter circuit of FIGURE 2 can be further balanced or unbalanced, however desired, by the physical positioning of the gate electrode next to either the drain region 72 or the source region 76 (as shown by way of example in transistor 48).

The circuits of FIGURES 1 and 4 can be employed in the feedback path of an oscillator configuration to produce an electrically tunable oscillator. The frequency selective circuit of FIGURE 4 can be used to select the frequency to be fed back thereby determining the frequency at which the circuit will oscillate. Both the gate electrode and substrate electrode control voltage may be employed to electrically tune the oscillator to a desired frequency in a manner similar to that as applied to the tuning of the frequency selective circuit of FIGURE 4.

What is claimed is:

1. In a frequency selective amplifier circuit including a semiconductor device having an input electrode, an output electrode and a control electrode, an input circuit connected to said input electrode and a common terminal for applying signals to be amplified, an output circuit connected between said output electrode and said common terminal for deriving amplified output signals, and a frequency selective circuit, said frequency selective circuit comprising:

a field-effect semiconductor device having first and second electrodes on a substrate of semiconductor material, said first and second electrodes forming rectifying junctions with said substrate, and a gate electrode insulated from said substrate;

means for coupling said first and second electrodes in a feedback path between said output circuit and said control electrode, and means for connecting said substrate and said gate electrode to said common terminal.

2. In a frequency selective amplifier circuit including a semiconductor device having an input electrode, an output electrode and a control electrode, an input circuit connected to said input electrode and a common terminal for applying signals to be amplified, an output circuit connected between said output electrode and said common terminal for deriving amplified output signals, and a variable frequency selective circuit, said frequency selective circuit comprising:

a field-effect semiconductor device having first and second electrodes on a substrate of semiconductor material, said first and second electrodes forming rectifying junction with said substrate, and a gate electrode insulated from said substrate;

means for coupling said first and second electrodes in a feedback path between said output circuit and said control electrode, means for coupling said substrate to said common terminal, and biasing means connected between said gate electrode and said common terminal for varying the frequency response of said frequency selective amplifier circuit.

3. A monolithic frequency selective amplifier circuit comprising:

a first and second field effect transistors each having a first and second regions formed on a common substrate of semiconductor material, each of said first and second regions forming rectifying junctions with said substrate, a portion of the substrate separating said first and second regions in each of said first and second transistors forming a channel of controllable conductivity, and two gate electrodes, each gate electrode being insulated from said common substrate and overlying a separate channel for controlling the conductivity of the respective channel the gate electrode overlies;

impedance means formed on said common substrate of semiconductor material coupled between said first region of said first transistor and a terminal adapted to be connected to a source of energizing potential;

the impedance means formed on said common substrate of semiconductor material coupled between said second region of said first transistor and a point of reference potential;

circuit means coupled between said second region of said first transistor and said point of reference potential providing a signal input circuit;

circuit means formed on said common substrate coupling said first region of said second transistor to the gate electrode of said first transistor;

circuit means coupled between said first region of said first transistor and said point of reference potential providing a signal output circuit;

impedance means formed on said common substrate coupling said first region of said first transistor to said second region of said second transistor;

circuit means coupling said grate electrode of said second transistor to said point of reference potential, and circuit means coupling said substrate to said point of reference potential.

4. An electrical circuit including a point of reference potential, a pair of terminals in the electrical circuit, and a frequency selective circuit connected between said terminals, said frequency selective circuit comprises:

a semiconductor device having input, output and control electrodes;

input circuit means connecting said input electrode to one of said pair of terminals for applying an input signal between said input electrode and said point of reference potential;

output circuit means connected between said output electrode and the other one of said pair of terminals;

a field-effect semiconductor device having first and second electrodes on a substrate of semiconductor material, said first and second electrodes forming rectifying junctions with said substrate, and a gate electrode insulated from said substrate;

means for coupling said first and second electrodes in a negative feedback path between said output circuit and said control electrode, and means for connecting said substrate and said gate electrode to said point of reference potential.

5. An electrical circuit including a point of reference potential, a pair of terminals in the electrical circuit, and a frequency selective circuit connected between said terminals, said frequency selective circuit comprises:

a semiconductor device having an input, output and control electrodes;

input circuit means connecting said input electrode to one of said pair of terminals for applying an input signal between said input electrode and said point of reference potential;

output circuit means connected between said output electrode and the other one of said pair of terminals;

a field-effect semiconductor device having first and second electrodes on a substrate of semiconductor material, said first and second electrodes forming rectifying junctions with said substrate, and a gate electrode insulated from said substrate;

means for coupling said first and second electrodes in a negative feedback path between said output circuit and said control electrode;

means for coupling said substrate to said point of reference potential, and biasing means connected between said gate electrode and said point of reference potential for varying the frequency response of said frequency selective circuit.

6. A frequency selective circuit comprising:

a field-effect transistor having a first and second regions formed on a substrate of semiconductor material with individual electrodes connecting each of said first and second regions and said substrate, the interface between said first and second regions and said substrate forming rectifying junctions showing capacitance characteristics, the portion of said substrate separating said first and second regions providing a channel of controllable resistivity between said regions, and a gate electrode insulated from said substrate and overlying at least a portion of said channel for controlling the resistivity thereof, said geometry of said gate electrode and said first and second regions forming capacitances between said gate electrode and said first and second regions;

input circuit means connected to one of said first and second region electrodes;

output circuit means connected to the other one of said first and second region electrodes;

circuit means for biasing said gate electrode and said substrate electrode relative to a common terminal to establish a relationship between the resistivity of said channel and the capacitance of said rectifying junctions, all with respect to said gate to first and second region capacitances, and the gate electrode input impedance to provide a frequency selective characteristic in the frequency range of signals to be applied between said common terminal and one of said first and second region electrodes, and means for applying a signal having frequency components within said given range of frequencies across said input circuit and said common terminal.

7. A frequency selective circuit comprising:

a field-effect transistor having a first and second regions formed on a substrate of semiconductor material with individual electrodes connecting each of said first and second regions and said substrate, the interface between said first and second regions and said substrate forming rectifying junctions showing capacitance characteristics, the portion of said substrate separating said first and second regions providing a channel of controllable resistivity between said regions, and a gate electrode insulated from said substrate and overlying at least a portion of said channel for controlling the resistivity thereof, said geometry of said gate electrode and said first and second regions forming capacitances between said gate electrode and said first and second regions;

input circuit means connected to one of said first and second regions electrodes;

output circuit means connected to the other one of said first and second region electrodes;

circuit means connecting said substrate electrode to a common terminal;

biasing means connecting the gate electrode to said common terminal to establish the relationship of said channel of controllable resistivity, said rectifying junction capacitance, said gate to first and second region capacitances, and gate electrode input impedance produce a notch filter for a given range of frequencies applied between said common terminal and one of said first and second region electrode that is a function of said biasing means, and means for applying a signal having frequency components within said given range of frequencies across said input circuit and said common terminal.

8. A frequency selective circuit comprising:

a field-effect transistor having a first and second regions formed on a substrate of semiconductor material with individual electrodes connecting each of said first and second regions and said substrate, the interface between said first and second regions and said substrate forming rectifying junctions showing capacitance characteristics, the portion of said substrate separating said first and second regions providing a channel of controllable resistivity between said regions and a gate electrode insulated from said substrate and overlying at least a portion of said channel for controlling the resistivity thereof, said geometry of said gate electrode and said first and second regions forming capacitances between said gate electrode and said first and second regions;

input circuit means connected to one of said first and second region electrodes;

output circuit means connected to the other one of said first and second region electrodes;

biasing means connecting said substrate electrode to said common electrode;

biasing means connecting said gate electrode to said common electrode whereby the relationship of said controllable resistive channel, said rectifying junction capacitances, said gate to first and second region capacitances, and gate electrode input impedance produce a notch filter for a given range of frequencies applied between said common terminal and one of said first and second region electrode that is a function of said substrate and gate electrode biasing means, and means for applying a signal having frequency components within said given range of frequencies across said input circuit and said common terminal.

References Cited

UNITED STATES PATENTS

| | | | |
|---|---|---|---|
| 3,212,032 | 10/1965 | Kaufman | 317—234 |
| 3,268,827 | 8/1966 | Carlson et al. | 307—88.5 |

JOHN W. HUCKERT, *Primary Examiner.*

J. D. CRAIG, *Assistant Examiner.*